US007755901B2

(12) United States Patent
Shen

(10) Patent No.: US 7,755,901 B2
(45) Date of Patent: Jul. 13, 2010

(54) HEAT DISSIPATING STRUCTURE FOR LIGHT EMITTING DIODES

(75) Inventor: Ching-Hang Shen, Kaohsiung (TW)

(73) Assignee: Asia Vital Components Co., Ltd., Kaohsiung (TW)

( * ) Notice: Subject to any disclaimer, the term of this patent is extended or adjusted under 35 U.S.C. 154(b) by 0 days.

(21) Appl. No.: 11/970,928

(22) Filed: Jan. 8, 2008

(65) Prior Publication Data

US 2009/0175045 A1 Jul. 9, 2009

(51) Int. Cl.
*H05K 7/20* (2006.01)
*G03B 21/18* (2006.01)

(52) U.S. Cl. ............. 361/719; 361/679.47; 361/679.52; 361/700; 174/16.3; 362/294; 362/373

(58) Field of Classification Search ................. 361/687, 361/679.47, 690–697, 700, 701, 702–712, 361/732, 756, 760, 762; 362/264, 294, 218, 362/267, 373, 345, 431, 545, 547, 580, 646, 362/652, 311; 174/15.1, 16.3, 252, 260; 165/80.2–80.5, 104.11, 104.21, 104.26, 104.33, 165/185; 257/712, 713, 714, 718, 719, 720, 257/E23.088, E23.101
See application file for complete search history.

(56) References Cited

U.S. PATENT DOCUMENTS

| | | | | |
|---|---|---|---|---|
| 6,113,212 | A * | 9/2000 | Ng | 347/18 |
| 6,517,221 | B1 * | 2/2003 | Xie | 362/373 |
| 6,839,367 | B2 * | 1/2005 | Nagamatsu et al. | 372/34 |
| 7,284,878 | B2 * | 10/2007 | Dorogi et al. | 362/218 |
| 7,298,044 | B2 * | 11/2007 | Liu | 257/720 |
| 7,329,030 | B1 * | 2/2008 | Wang | 362/373 |
| 7,360,903 | B2 * | 4/2008 | Yamada | 353/54 |
| 7,378,766 | B2 * | 5/2008 | Vasilescu et al. | 310/58 |
| 7,431,478 | B2 * | 10/2008 | Lee | 362/294 |
| 7,438,449 | B2 * | 10/2008 | Lai et al. | 362/373 |
| 7,513,651 | B2 * | 4/2009 | Chen | 362/294 |
| 2002/0121097 | A1 * | 9/2002 | Chiu et al. | 62/3.7 |
| 2006/0203206 | A1 * | 9/2006 | Kim | 353/58 |
| 2006/0245214 | A1 * | 11/2006 | Kim | 362/632 |
| 2007/0090737 | A1 * | 4/2007 | Hu et al. | 313/11 |
| 2007/0201232 | A1 * | 8/2007 | Chen | 362/294 |
| 2008/0112597 | A1 * | 5/2008 | Asano | 382/115 |
| 2008/0117597 | A1 * | 5/2008 | Zhou et al. | 361/700 |
| 2009/0027888 | A1 * | 1/2009 | Yu et al. | 362/294 |

FOREIGN PATENT DOCUMENTS

| | | | | |
|---|---|---|---|---|
| CN | 20114577 | Y | * | 10/2008 |
| EP | 1 717 632 | A1 | * | 2/2006 |
| JP | 362066958 | A | * | 3/1987 |
| JP | 2005340065 | A | * | 12/2005 |
| JP | 02006019557 | A | * | 1/2006 |
| JP | 02006227072 | A | * | 8/2006 |

* cited by examiner

*Primary Examiner*—Michael V Datskovskiy

(57) ABSTRACT

A heat dissipating structure associated with light emitting diodes includes a circuit substrate, a guide heat component, a heat dissipating device. The circuit substrate is attached with light emitting diodes. The guide heat component has a first end contacting the circuit substrate and a second end contacting with fins, which are provided with the heat dissipating device. The heat generated by the light emitting diodes is transmitted to the heat dissipating device via the guide heat pipe and then dissipated outward via the heat dissipating device.

4 Claims, 6 Drawing Sheets

HEAT DISSIPATING STRUCTURE FOR LIGHT EMITTING DIODES

BACKGROUND OF THE INVENTION

1. Field of the Invention

The present invention is related to a heat dissipating structure and particularly to a heat dissipating structure for light emitting diodes (LED).

2. Brief Description of the Related Art

Due to the super bright LED being available in the market and technology related to the white light LED being getting mature products such as the desk lamp and the projector lamp, which utilizes the LED, have been developed gradually. It means the era of LED illumination is coming and it even could replace the currently used white heat tungsten bulb as a primary light source of the indoor illumination in the future. Taiwan Patent number I270990 discloses a LED structure, which at least includes a base plate; a semiconductor epitaxial structure, which further at least includes a N-type semiconductor layer, an active layer and a P-type semiconductor layer, wherein the N-type semiconductor layer covers the base plate and forms a plurality of abrupt objects on the surface thereof with a passage between any two neighboring abrupt objects, and the active layer and the P-type semiconductor stacks on the abrupt objects sequentially; a N-type electrode layer, which is attached to the N-type semiconductor layer and disposed in the passage; and a plurality of P-type electrodes, which are disposed on the P-type semiconductor layer.

However, the brightness of the LED increasing gradually results in generating a great deal of heat in the process of emitting light due to low conversion efficiency of the electrical energy to light. If the heat is not guided immediately, it not only shortens life spans of the light emitting diodes but also damages neighboring electronic components or, even seriously, causes accident of firing. Therefore, how to remove the heat generated by the LED promptly is a great subject worth the manufacturer to endeavor.

SUMMARY OF THE INVENTION

A main object of the present invention is to provide a heat dissipating structure for light emitting diodes with which the heat produced in the process of emitting light is capable of being guided outward effectively.

In order to achieve the preceding object, a heat dissipating structure for light emitting diodes according to the present invention includes a circuit substrate, a guide heat component, and a heat dissipating device. The circuit substrate is attached with at least a light emitting diode and a circuit for supplying power required by the light emitting diode. The guide heat component has a first end contacting the circuit substrate and a second end contacting with the heat dissipating device.

BRIEF DESCRIPTION OF THE DRAWINGS

The detail structure, the applied principle, the function and the effectiveness of the present invention can be mere fully understood with reference to the following description and accompanying drawings, in which.

DETAILED DESCRIPTION OF THE INVENTION

Figure 1:
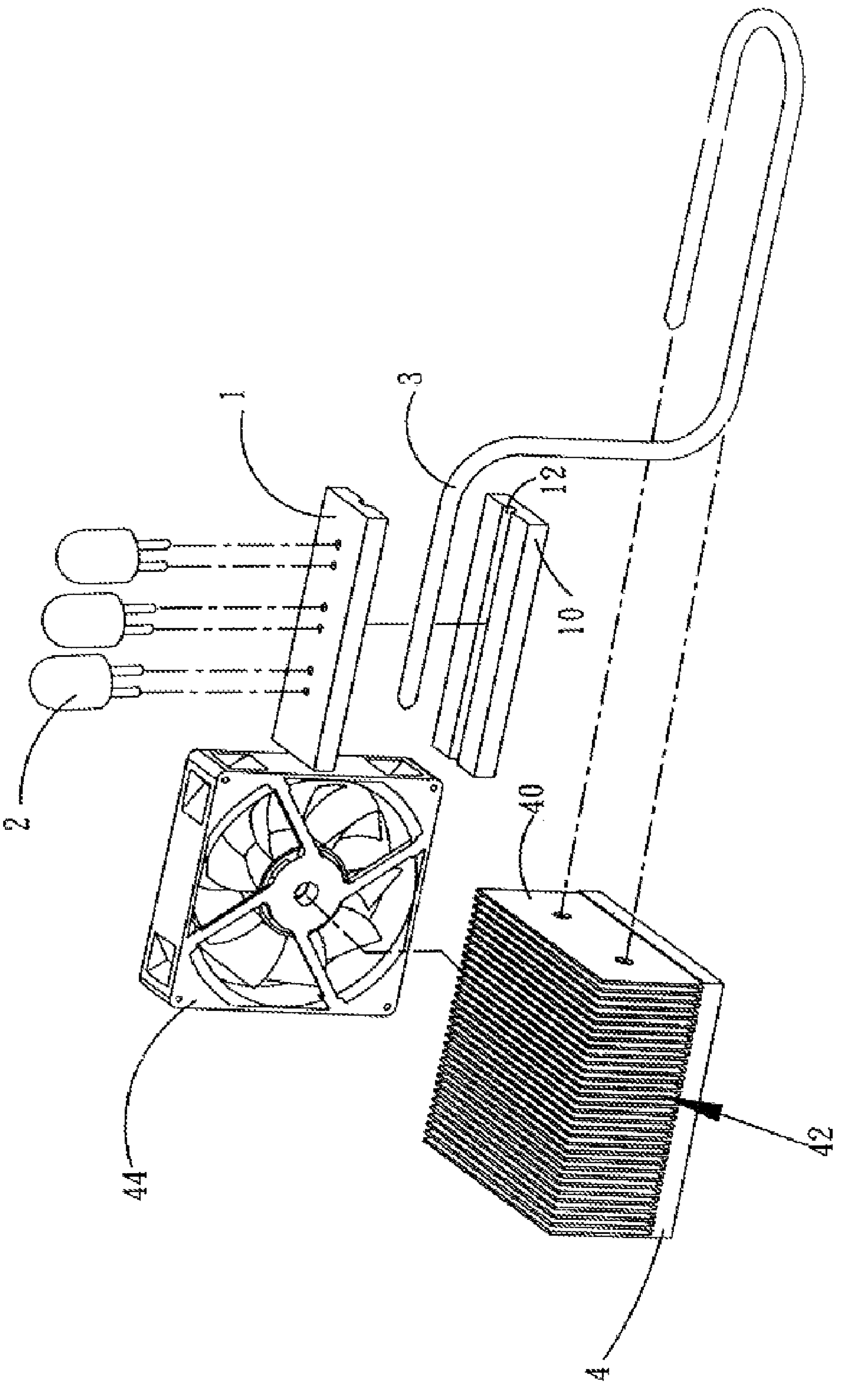
FIG. 1 is a disassembled perspective view of a preferred embodiment of a heat dissipating structure for light emitting diodes according to the present invention.
Figure 2:
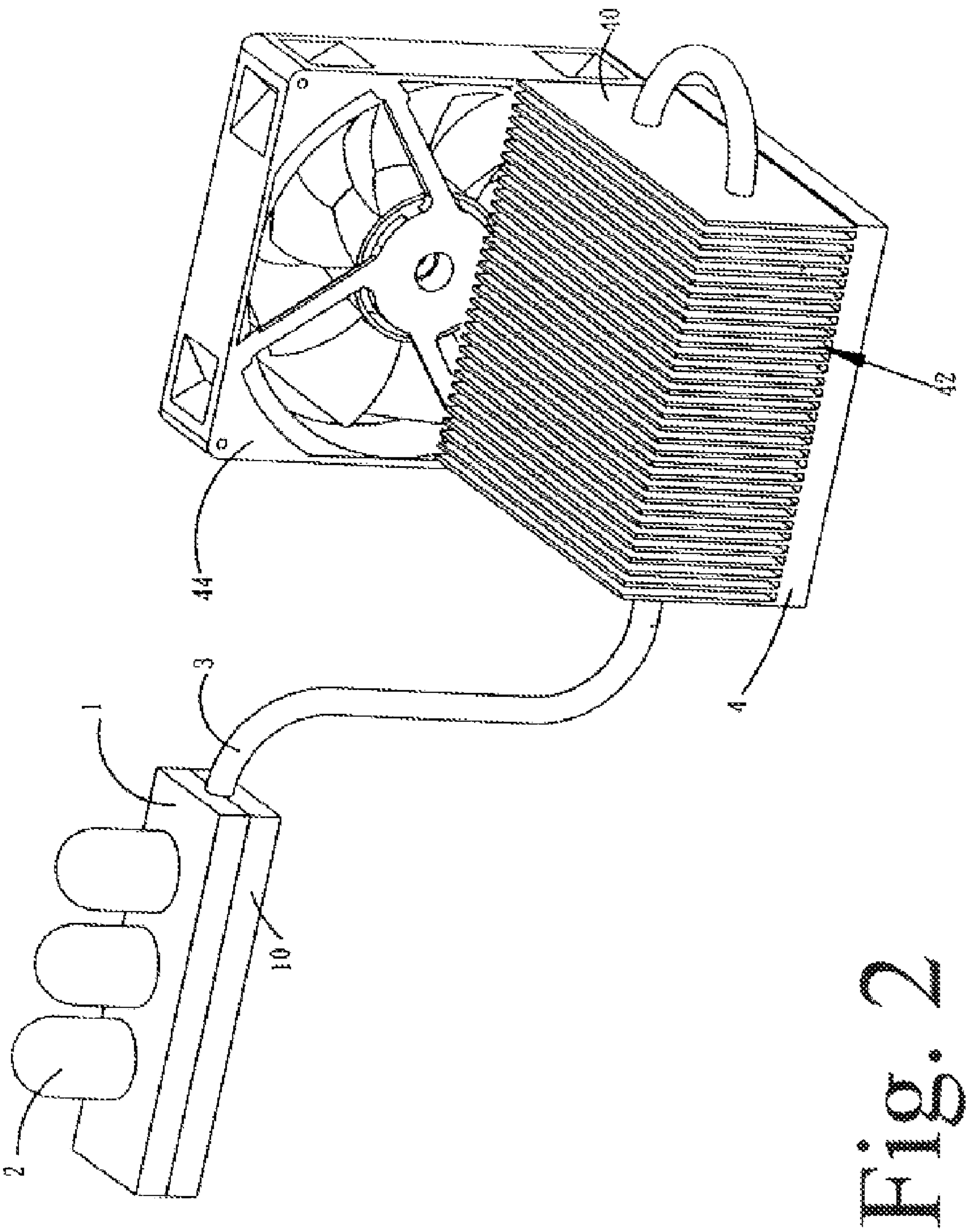
FIG. 2 is a perspective view of the heat dissipating structure for light emitting diodes shown in FIG. 1.

Referring to FIGS. 1 and 2, the first preferred embodiment of a heat dissipating structure for light emitting diodes according to the present invention includes following components:

a circuit substrate 1, which is distributed with circuits (not shown) and provides at least a light emitting diode 2, providing a base 10 with a containing space 12;

a guide heat component 3, which is a guide heat pipe, having a first pipe section, which includes an end thereof contacting with the circuit substrate 1 and being received in the containing space 12; and a heat dissipating device 4, which includes a plurality of fins 40 to space apart a clearance 42 from each other and contact with a second pipe section of the guide heat component 3, and a fan 44 beside the fins 40;

wherein, the second pipe section, which includes the other end of the guide heat component 3, passes through the fins 40 and the air flow induced by the fan 44 moves along the respective clearance 42 to remove heat transmitted by the fins 40.

Figure 3:
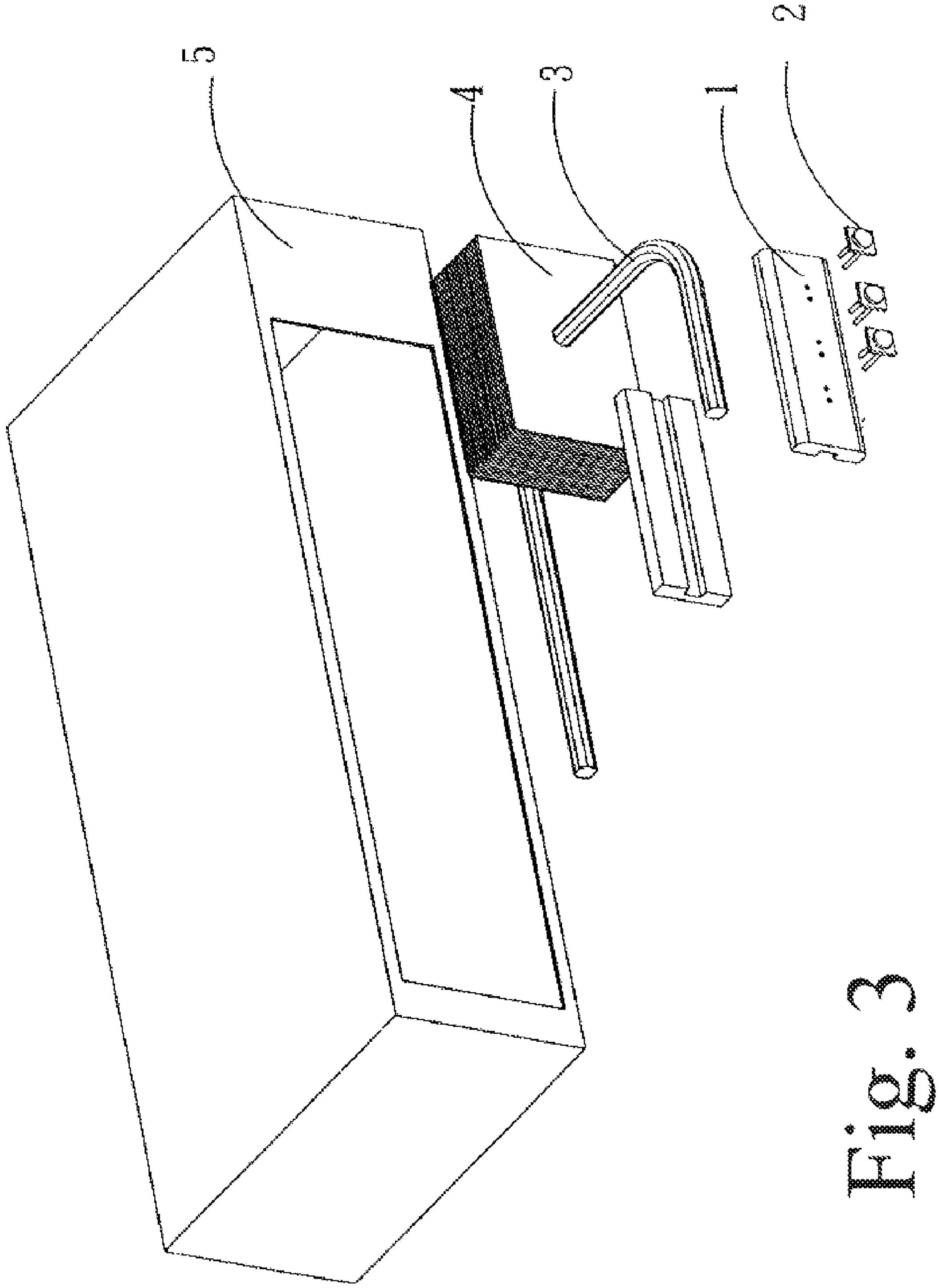
FIG. 3 is a disassembled perspective view of another preferred embodiment of a heat dissipating structure for light emitting diodes according to of the present invention.
Figure 4:
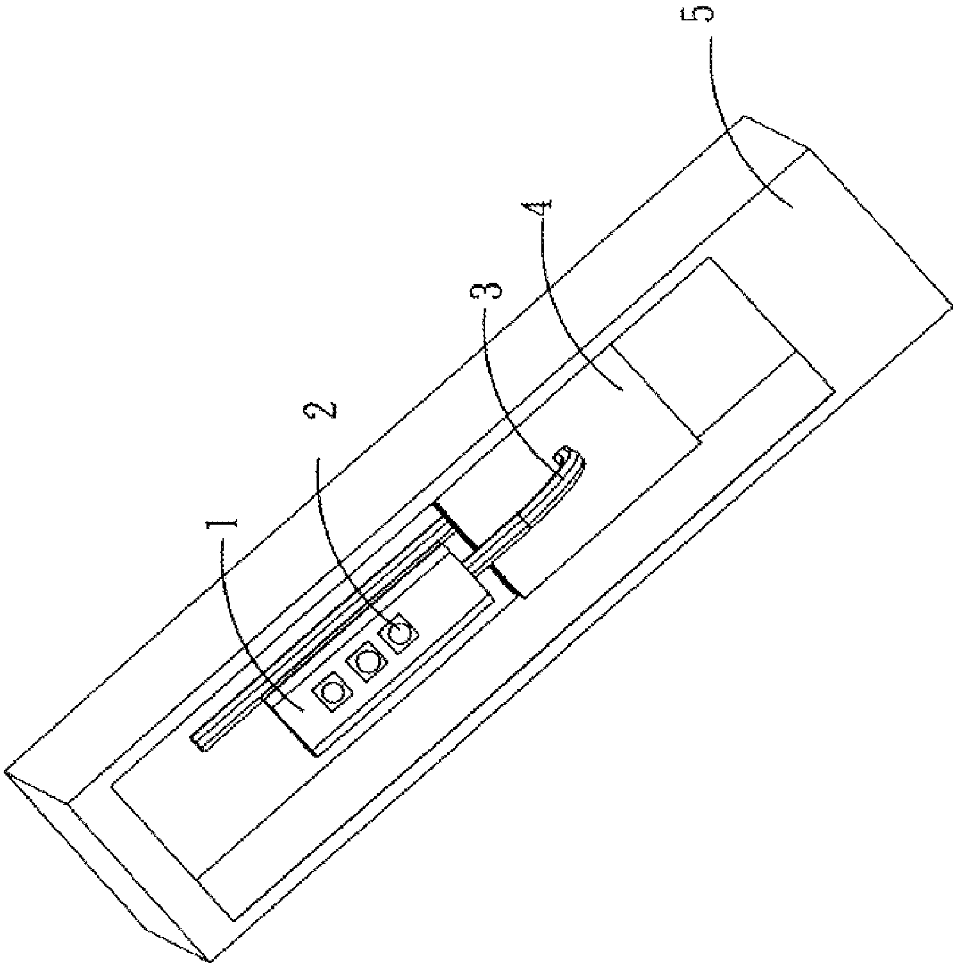
FIG. 4 is a perspective view of the heat dissipating structure for light emitting diodes shown in FIG. 3.

Referring to FIGS. 3 and 4, the second preferred embodiment of a heat dissipating structure for light emitting diodes according to the present invention is illustrated. The heat dissipating structure associated with fight emitting diodes is received in a casing 5 to protect the circuit substrate 1, the light emitting diodes 2, the guide heat component 3 and the heat dissipating device 4 and it is capable to isolate foreign moisture, rain and dirt.

Figure 5:
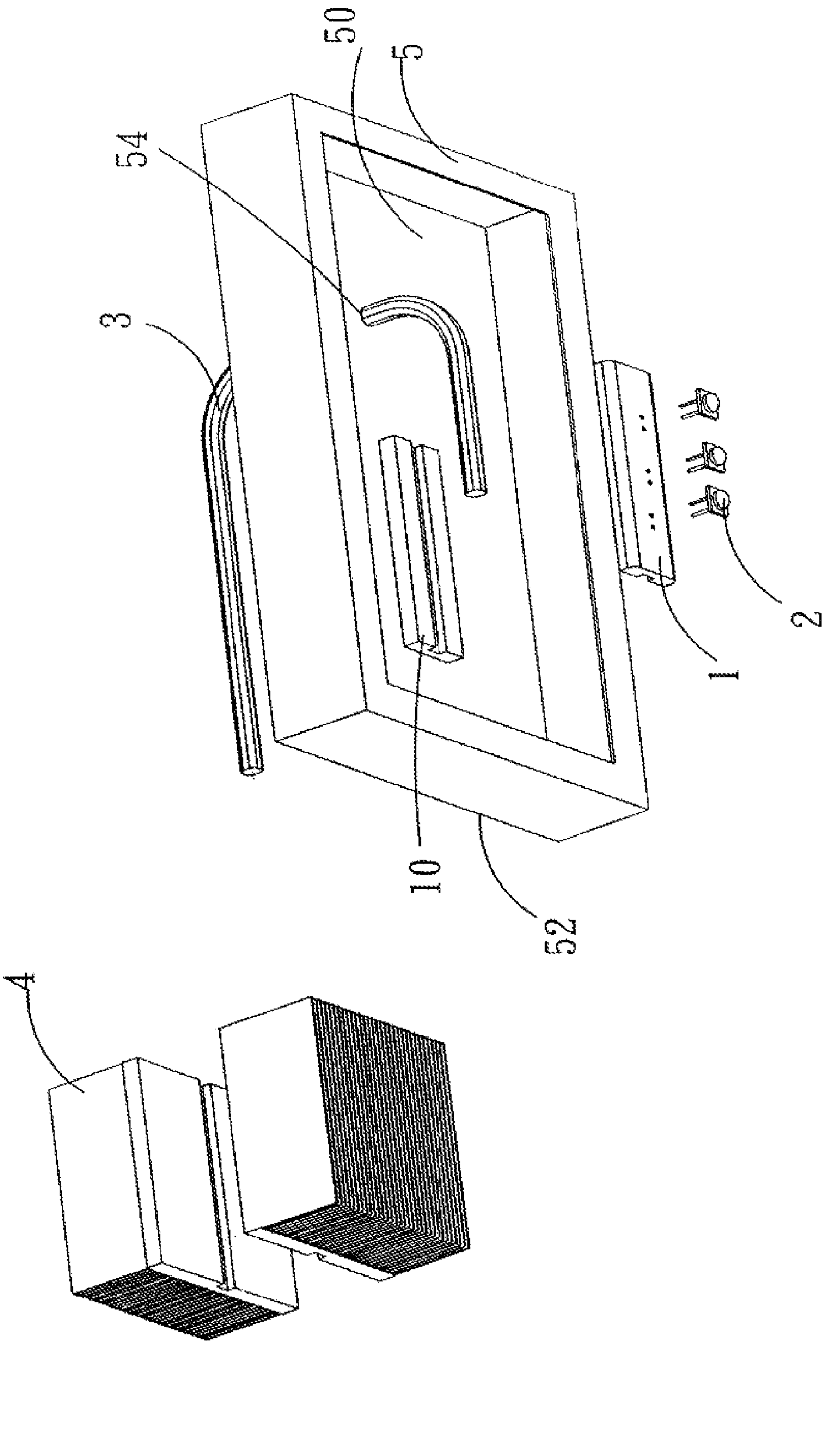
FIG. 5 is a disassembled perspective view of a further preferred embodiment of a heat dissipating structure for light emitting diodes according to of the present invention.
Figure 6:
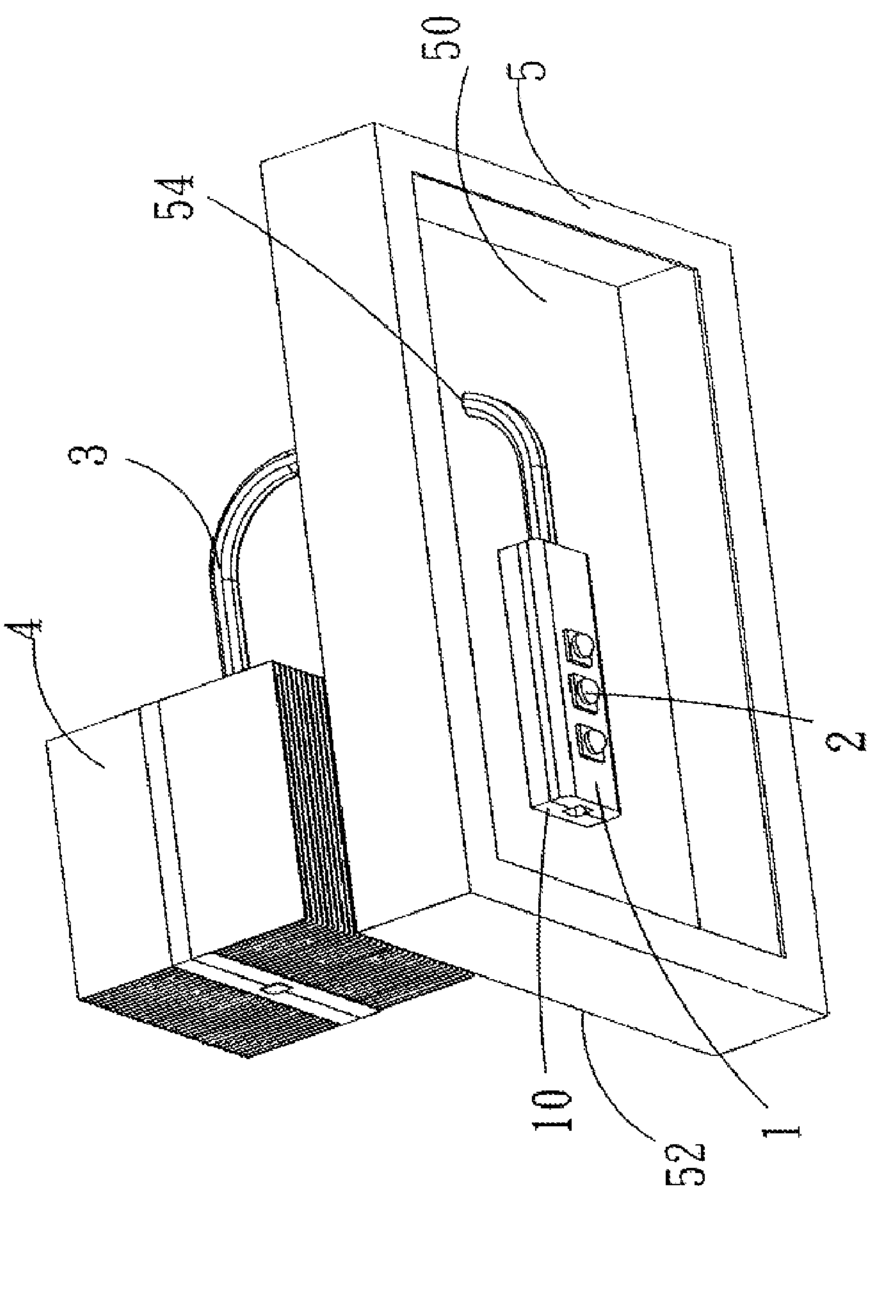
FIG. 6 is a perspective view of the heat dissipating structure for light emitting diodes shown in FIG. 5.

Referring to FIGS. 5 and 6, the third preferred embodiment of a heat dissipating structure for light emitting diodes according to the present invention is illustrated. The casing 5 has a partition, which is disposed along a position of the depth thereof with a first surface 50 and a second surface 52. The circuit substrate 1 and the base 10 are attached to the first surface 50, and the heat dissipating device 4 is provided at the second surface 52. A through hole 54 is provided at the partition for the guide heat component 3 being capable of passing through the through hole 54. Further, the fins are composed of two fin parts with each of the fin part having a lateral side facing to each other and the lateral side attached with a locating plate, which has an elongated locating recess corresponding to each other for locating the second pipe section of the guide heat component 3. In this way, the casing 5 not only isolates the foreign moisture, rain and dirt but also allows the heat dissipating device 4 being disposed in the external open space to enhance effect of heat dissipation.

It is appreciated that 2 heat dissipating structure for light emitting diodes according to the present invention is capable of guiding heat, which is produced in the process of the light emitting diodes 2 emitting the light converted from the electrical energy, outward rapidly to avoid shortcomings such as short life spans of the light emitting diodes, damages of neighboring electronic components or causing accident of firing. Besides, the provision of the casing 5 is capable of isolating the foreign moisture, rain effectively.

While the invention has been described with referencing to the preferred embodiments thereof, it is to be understood that modifications or variations may be easily made without departing from the spirit of this invention which is defined by the appended claims.

What is claimed is:

1. A heat dissipating structure associated with light emitting diodes comprising:

a rectangular circuit substrate with a first facial side providing at least a light emitting diode and a bottom side providing an elongated lower semicircular groove between two opposite long lateral sides of said bottom side, wherein said upper semicircular groove extends along and parallels to said long lateral sides;

a base having a shape the same as said circuit substrate with a second facial side providing an elongated upper semicircular groove between two opposite long lateral sides of said second facial side corresponding to said lower semicircular groove such that said base is joined to said substrate in such a way that said upper semicircular groove and said lower semicircular groove form an elongated circular receiving space;

a guide heat pipe with a first end and a second end having a first pipe section, which includes said first end and a second pipe section, which includes said second end, wherein said first section is disposed in said circular receiving space;

a heat dissipating device with a plurality of fins being pierced with said second pipe section;

a casing to accommodate said circuit substrate with said base, said guide heat pipe and said heat dissipating device;

wherein said casing provides a partition disposed along the middle of the depth thereof, said partition has a first surface for being attached with said base, a second surface for being disposed with said heat dissipating device and a through hole for being pierced with said guide heat pipe.

2. The heat dissipating structure associated with light emitting diodes as defined in claim 1, wherein said second pipe section is U-shaped and pierces said fins twice.

3. The heat dissipating structure associated with light emitting diodes as defined in claim 1, wherein said fins are composed of two fin parts, wherein each of said fin parts has a lateral side to face to each other with a locating plate at said lateral side having a locating recess corresponding to each other for locating said second pipe section.

4. The heat dissipating structure associated with light emitting diodes as defined in claim 1, wherein said heat dissipating device further comprises a fan which is disposed next to said fins for inducing air flows to pass through said fins.

* * * * *